United States Patent
Tamma et al.

(10) Patent No.: US 10,804,440 B2
(45) Date of Patent: Oct. 13, 2020

(54) LIGHT EXTRACTION THROUGH ADHESIVE LAYER BETWEEN LED AND CONVERTER

(71) Applicant: LUMILEDS HOLDING B. V., Schiphol (NL)

(72) Inventors: Venkata Ananth Tamma, San Jose, CA (US); Kentaro Shimizu, San Jose, CA (US); Vernon K Wong, San Jose, CA (US)

(73) Assignee: Lumileds Holding B.V. (NL)

( * ) Notice: Subject to any disclaimer, the term of this patent is extended or adjusted under 35 U.S.C. 154(b) by 8 days.

(21) Appl. No.: 16/230,876

(22) Filed: Dec. 21, 2018

(65) Prior Publication Data
US 2020/0203577 A1 Jun. 25, 2020

(51) Int. Cl.
*H01L 33/50* (2010.01)
*H01L 33/10* (2010.01)
*H01L 33/46* (2010.01)

(52) U.S. Cl.
CPC ............ *H01L 33/502* (2013.01); *H01L 33/10* (2013.01); *H01L 33/46* (2013.01); *H01L 2933/0083* (2013.01); *H01L 2933/0091* (2013.01)

(58) Field of Classification Search
CPC .................................................. H01L 33/502
USPC ........................................................ 257/98
See application file for complete search history.

(56) References Cited

U.S. PATENT DOCUMENTS

| | | | |
|---|---|---|---|
| 6,845,572 B1* | 1/2005 | Haimerl | A43B 7/12 36/12 |
| 2009/0129115 A1* | 5/2009 | Fine | F21V 9/32 362/606 |
| 2009/0141476 A1* | 6/2009 | Meir | G02B 6/005 362/84 |
| 2010/0002414 A1* | 1/2010 | Meir | G02B 6/0023 362/84 |
| 2010/0019260 A1* | 1/2010 | Epler | H01L 33/16 257/98 |
| 2010/0183880 A1 | 7/2010 | Ogawa | |
| 2012/0170303 A1* | 7/2012 | Meir | G02B 6/0041 362/555 |
| 2012/0313136 A1 | 12/2012 | Chung | |
| 2014/0311572 A1* | 10/2014 | De Boer | H01L 31/02327 136/259 |
| 2014/0333846 A1* | 11/2014 | Chen | G02F 1/13338 349/12 |

FOREIGN PATENT DOCUMENTS

| | | |
|---|---|---|
| EP | 2176892 A1 | 4/2010 |
| JP | 2007305998 A | 11/2007 |

OTHER PUBLICATIONS

Yu et al., "Light Propagation with Phase Discontinuities: Generalized Laws of Reflection and Refraction," Science, 333-337 (Oct. 21, 2011).

(Continued)

*Primary Examiner* — Jami Valentine Miller

(57) ABSTRACT

An adhesive layer is disclosed and may include a plurality of short chain molecules, each of the plurality of the short chain molecules including a first end and a second end such that the distance between the first end and second end is less than 100 nm and such that first end is configured to attach to a first surface and the second end is configured to attach to a second surface.

19 Claims, 9 Drawing Sheets

(56) References Cited

OTHER PUBLICATIONS

Gotesman et al., "Selective Surface Patterning for the Coadsorption of Self-Assembled Gold and Semiconductor Nanoparticles", vol. 24, No. 12, Jun. 1, 2008, pp. 5981-5983.
European Patent Office Patent Abstracts of Japan; Publication No. 2007305998; published Nov. 22, 2007, LG Innotek Co Ltd; 1 page.
PCT International Search Report corresponding to PCT/IB2019/001370, dated Feb. 4, 2020, 4 pages.
PCT Written Opinion of the International Searching Authority corresponding to PCT/IB2019/001370, dated Feb. 4, 2020, 5 pages.

* cited by examiner

LIGHT EXTRACTION THROUGH ADHESIVE LAYER BETWEEN LED AND CONVERTER

BACKGROUND

A typical light-emitting diode (LED) may include a glue layer between different layers of the LED such as, for example, between a substrate and a wavelength converting layer. The glue layer may have a lower refractive index than both the substrate and the wavelength converting layer. As a result, the critical angle for Total Internal Reflection may be low (e.g., ~52 degrees). This TIR causes a reduction in power transmitted from the substrate to the wavelength converting layer.

Additionally, the glue layer may behave as a channel to guide photons along the interface between the substrate and wavelength converting layer. This channel may eventually cause leaking of photons from the edge of the LED.

The effects noted above may reduce the total flux emitted by an LED in the forward direction.

SUMMARY

An adhesive layer is disclosed and may include a plurality of short chain molecules, each of the plurality of the short chain molecules including a first end and a second end such that the distance between the first end and second end is less than 100 nm and such that first end is configured to attach to a first surface and the second end is configured to attach to a second surface.

BRIEF DESCRIPTION OF THE DRAWINGS

A more detailed understanding can be had from the following description, given by way of example in conjunction with the accompanying drawings wherein.

DETAILED DESCRIPTION

Figure 1A:
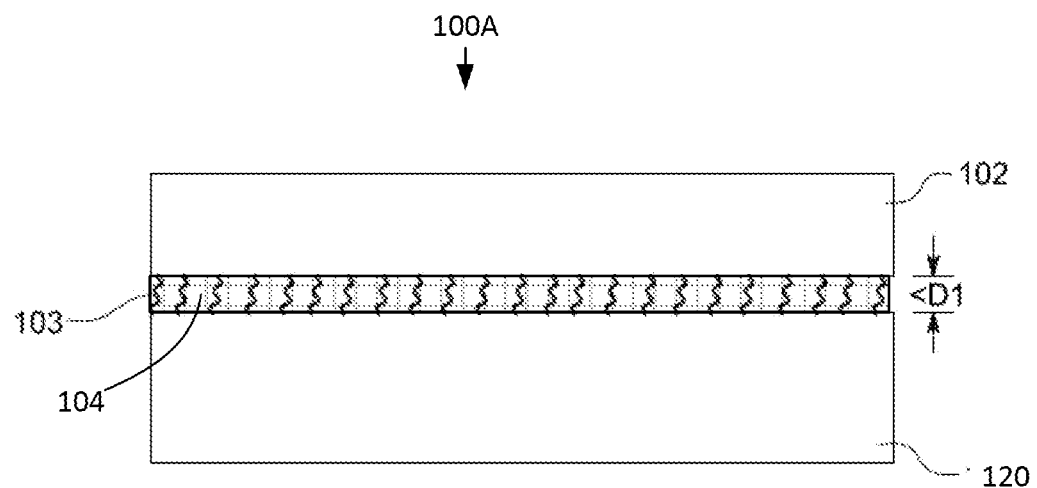
FIG. 1A is a diagram of a light emitting device with a short chain molecule layer.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices or optical power emitting devices, such as devices that emit ultraviolet (UV) or infrared (IR) optical power, are among the most efficient light sources currently available (hereinafter "LEDs"). These LEDs, may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

LEDs that increase optical power transmitted through an adhesive layer and, thereby, improve the total flux emitted by the LED are disclosed herein. The adhesive layer may be designed such that photon leaking from a side of the LED is reduced. Adhesive layer composition, and nano-structure layers that increase transmitted optical power are disclosed.

Typically, substrates may be connected to wavelength converting layers using a glue layer without the chain link molecules disclosed herein. Such glue layers typically have a thickness between 0.5 and 3 micrometers. Such glue layer is typically an organic silicone with a refractive index that varies from 1.4 to 1.6, depending on the material type and composition. The refractive index of the substrate (e.g., sapphire) and wavelength converting layers is typically higher than the refractive index such a glue layer. For example, typical values of refractive index (n) at a wavelength 450 nm are 1.78, 1.41 and 1.76, for sapphire, such typical glue layers, and wavelength converting layers, respectively. Notably, since $n_{sapphire} > n_{glue}$, the critical angle for Total Internal Reflection (TIR), θc=52.4 degrees when using typical glue layers. TIR causes a reduction in the power transmitted from substrate (e.g., sapphire) to the wavelength converting layer, through the glue layer. In addition, such typical glue layers can also exhibit channel behavior to guide photons along the interface of such glue layers and the substrate, the photons eventually leaking out from such a glue layer, at the edge of the LED. The TIR and the leaking of photons reduce the total flux emitted by an LED in the forward direction.

The LEDs disclosed herein may include adhesive material with short chain molecules that allow the reduction of thickness of the adhesive layer. The thickness may be reduced to less than 100 nm or may be less than 10 nm such that it approaches near zero thickness. Alternatively, or in addition, the LEDs disclosed herein may include a nanostructure layer disposed at the interface between an adhesive layer and a substrate such that the nano-structure layer modifies the critical angle for total internal reflection (TIR) to allow increased emission.

FIG. 1A shows example short chain molecules 103. Short chain molecules may include any short polymer chain such that at each end of the chain is a linker molecule. Alternatively, or in addition, short chain molecules may include short DNA strands that have linker molecules on each end. Examples of short chain molecules include, but are not limited to, alkyl chains such as octyl phosphonic acid, decyl phosphonic acid, or octadecylphosphonic acid but terminated on both ends by a phosphonic acid, carboxylic acid, and/or thiol groups. For example, carboxylic acids are found to react with aluminium oxides via a topotactic reaction such that the carboxylate acts as a bridging ligand. This reaction allows for carboxylate-functionalized alumina nanoparticles to be prepared directly from boehmite (AlOOH).

Figure 1B:
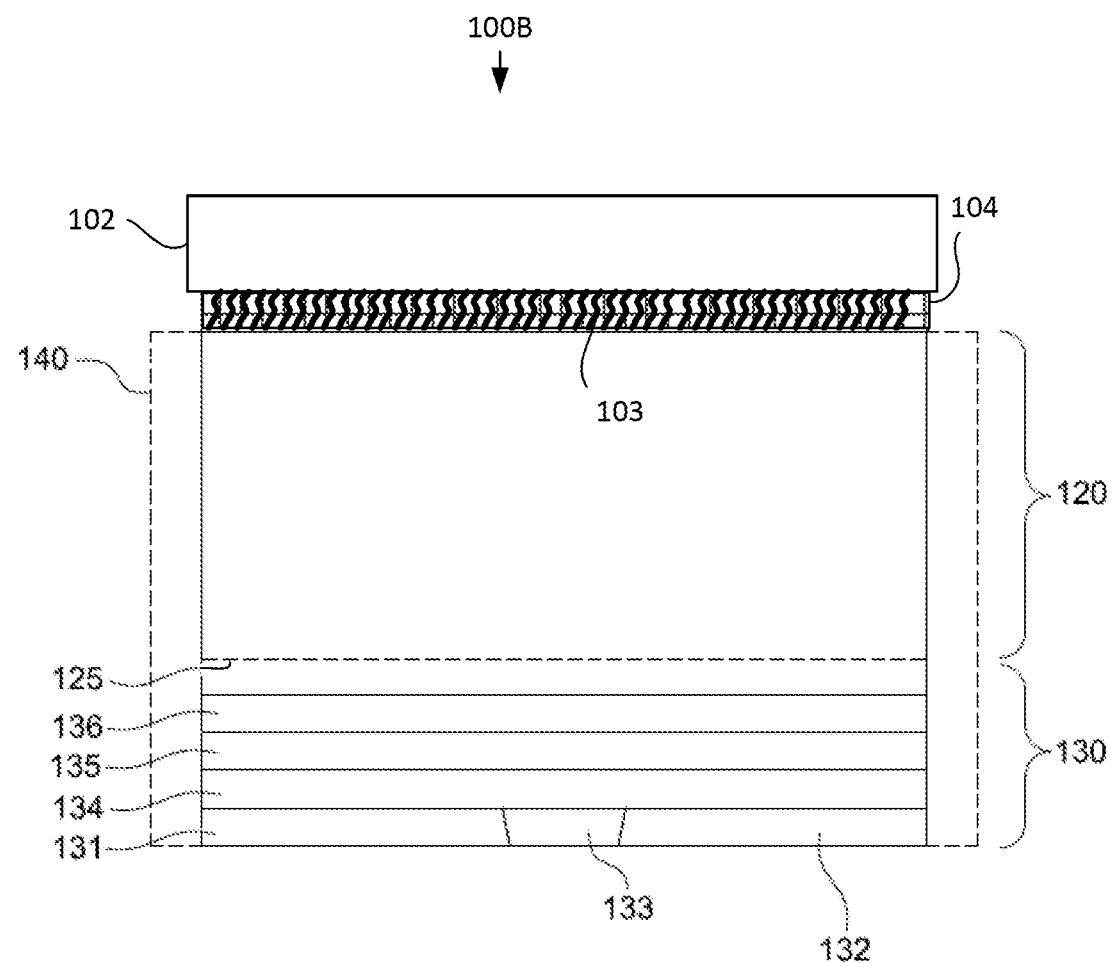
FIG. 1B is a flow diagram for generating part of an light emitting device.

LED layers 100A, as shown in FIG. 1A includes a substrate 120, an adhesive layer 104 which includes short chain molecules 103 and that connects the substrate 101 to a wavelength converting layer 102. FIG. 1B shows LED device 100B which includes the LED layers 100A as well as device that includes an epitaxial grown semiconductor layers 130. The epitaxial grown semiconductor layers 130 may include a first contact 131 and a second contact 132 separated by a gap 133 which may be an airgap or may be filled with dielectric material. A p-type layer 134 may be proximate to an active layer 135 and an n-type layer 136. The active layer 135 may be configured to emit light distal from the contacts 131 and 132 such that light beams emitted from the active layer 135 are generally emitted towards the substrate 120. The LED device 100 is presented in a simplified form for ease of understanding of the invention, knowing that one possessing an ordinary skill in the pertinent arts would understand the other elements included within an LED.

The epitaxial grown semiconductor layers 130 may be formed from any applicable material configured to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to, Ge, Si, SiC, and mixtures or alloys thereof. These example materials may have indices of refraction ranging from about 2.4 to about 4.1 at the typical emission wavelengths of LEDs in which they are present.

For example, Aluminum nitride (AlN) may be used and is a wide band gap (6.01-6.05 eV at room temperature) material. AlN may have refractive indices of about 1.9-2.2 (e.g., 2.165 at 632.8 nm). III-Nitride semiconductors, such as GaN, may have refractive indices of about 2.4 at 500 nm, and III-Phosphide semiconductors, such as InGaP, may have refractive indices of about 3.7 at 600 nm. An example gallium nitride (GaN) layer may take the form of a layer of pGaN. As would be understood by those possessing an ordinary skill the pertinent arts, GaN is a binary III/V direct bandgap semiconductor commonly used in light-emitting diodes. GaN may have a crystal structure with a wide band gap of 3.4 eV that makes the material ideal for applications in optoelectronics, high-power and high-frequency devices. GaN can be doped with silicon (Si) or with oxygen to create an n-type GaN and with magnesium (Mg) to create a p-type GaN as is used in the present example. The active layer 135 is the region where light is emitted as electroluminescence occurs. Contacts 131 and/or 132 coupled to the LED device 100 may be formed from a solder, such as AuSn, AuGa, AuSi or SAC solders.

LED device 100B of FIG. 1B may be a high brightness emitter or a medium power emitter such as a chip scale package (CSP) die with a sapphire substrate. As shown in FIG. 1B, adhesive layer 104 with short chain molecules 103 may be located between substrate 120 and wavelength converting layer 102. The substrate 120 may include a smooth LES that enables deposition of the adhesive layer 104 with short chain molecules 103. The substrate 120 may comprise sapphire which is an aluminum oxide (Al2O3) also known as corundum and can exhibit properties including being very hard, strong, easy to machine flat, a good electrical insulator, and an excellent thermal conductor. Sapphire is generally transparent when produced synthetically, with the blue color in naturally occurring sapphires (and the red in rubies, which are another form of corundum) comes from impurities in the crystal lattice. In other LEDs, the sapphire may be replaced with gallium nitride (GaN). The semiconductor layers 130 may be in the region where light is emitted as electroluminescence occurs.

As shown in FIG. 1B, the sidewalls of the substrate 120 may be covered by sidewall material 140. The sidewall material 140 may also cover one or more layers of the semiconductor layers 130 such that either the same sidewall material 140 covers the substrate 120 and the semiconductor layers 130 or a different material may cover the sidewalls of the substrate 120 than the semiconductor layers 130. The sidewall material 140 may be any applicable reflecting or scattering material. According to an embodiment, the sidewall material 140 may be a distributed Bragg reflector (DBR).

By way of example and in order to provide concrete description, a flip chip of chip scale package (CSP) LED with a sapphire substrate is described, although the principles and teaching herein may be applied to any applicable LED design. A sapphire based CSP emitter with a smooth light escape surface (LES) may allow deposition of adhesive layer 104 with short chain molecules 103 such that light emitted from the active layer 135 is incident upon the adhesive layer 104 with short chain molecules 103, via the sapphire substrate.

As shown in FIG. 1A, $D_1$ represents the thickness of the adhesive layer 104 with short chain molecules 103. The thickness may be as small as possible and may be less than 100 nm or more preferably may be less than 10 nm, or more preferably may approach zero. This small thickness D1 (e.g., approaching zero) may be obtained by use of the chain molecules 103 that enable the required amount of adhesion from the adhesive layer 104 while allowing its thickness to approach zero.

The adhesive layer 104 may include polymer materials with short molecular length or short length/chain polymer (collectively "short chain molecules 103"). As disclosed, the thickness of the adhesive layer 104 may be less than 100 nm, less than 10 nm and preferably may approach 0. At such thickness, which are sub wavelength, the effect of Frustrate TIR (FTIR) will begin to dominate due to the tunneling of photons through the adhesive layer 104 thickness between the substrate 120 and wavelength converting layer 102. The effect of FTIR with the disclosed implementation may be such that the lower refractive index of the adhesive layer 104 can be considered a potential barrier, through which photons can tunnel. The tunneling of the photons may negate or mitigate the effect of TIR such that the critical angle is effectively increased. Alternatively or in addition, the tunneling via the FTIR effect may negate or mitigate the photon leaking caused by channels created at typical adhesive layers.

Figure 1C:
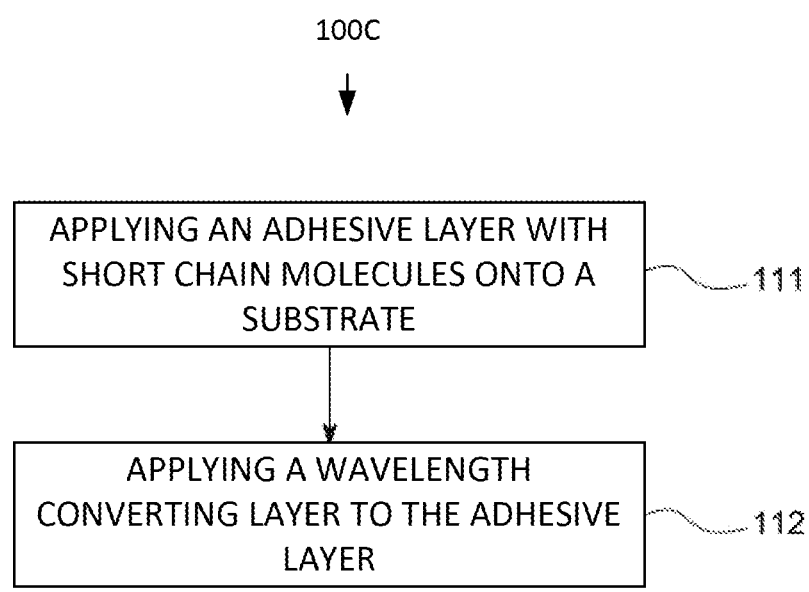
FIG. 1C is a diagram of a light emitting device with a nano-structure layer.

FIG. 1C shows a flow diagram 100C that outlines the steps 111 and 112 for manufacturing LED layers 100A and/or LED device 100B. As shown, at step 111 an adhesive layer with short chain molecules may be applied to a substrate. The adhesive layer with short chain molecules may be applied via any applicable manner such as pouring, depositing (e.g., Atomic layer deposition (ALD)) chemical application, mesh deposition, or the like. At step 112, a wavelength converting layer may be applied to the adhesive layer. The wavelength converting layer may be applied in any applicable manner such as by pouring, depositing (e.g., Atomic layer deposition (ALD)) chemical application, mesh deposition, or the like.

According to embodiments, a substrate (e.g., 120 of FIG. 1B) and wavelength converting layer (e.g., 102 of FIG. 1B) surface can be surface treated or coated to have an organosilane self-assembled monolayer (SOM), to increase or improve the application or bonding of short chain molecules. As disclosed herein, the evanescent waves and/or photons in the substrate region can tunnel through the adhesive layer, increasing the overall flux emitted by the LED. The tunneling probability may be exponentially dependent on the thickness and properties of the adhesive layer or the gap occupied the adhesive layer as well as the wavevector of light. Accordingly, the total flux of the LED dependent on the product, or other applicable relationship, of the wavevector and adhesive layer/gap.

According to an embodiment of the disclosed subject matter, a nano-structure layer may be deposited at the interface between an adhesive layer and a substrate of an LED such that the adhesive layer attaches the substrate to a wavelength converting layer. The adhesive layer may form a viable bond between the substrate and the wavelength converting layer and may have a low refractive index such as, for example, between 1.41-1.5. The adhesive layer may include a nano-structure layer, as disclosed herein, and may also include one or more types of silicone. The wavelength converting layer may be a ceramic phosphor platelet or any other applicable material that converts the wavelength of light incident upon the layer, as disclosed herein.

A nano-structure layer, as disclosed herein, may be deposited on top of a substrate at the interface between an adhesive layer and the substrate. The nano-structure layer can be metamaterials or metasurfaces composed of cylinders or cubes made up of large refractive index materials such as titanium dioxide, gallium nitride or silicon. The nano-structure layer may transmit radiation incident upon a substrate (e.g., radiation originating from an LED active layer) and extend the TIR critical angle beyond the natural TIR critical angle created by the change in refractive index (RI) (i.e., high RI of the substrate to low RI of the adhesive layer). To achieve this, the nano-structure layer has a local phase gradient at the location where the light beams strike the interface of the nano-structure layer. Equation 1 shows the general law of reflection and refraction:

$$\sin\theta_t n_t - \sin\theta_i n_i = \frac{\lambda_0}{2\pi}\frac{d\varphi}{dx} \qquad \text{(Equation 1)}$$

In Equation 1, the subscript 't' refers to the media located at the top of interface (i.e., the adhesive material) and 'i' refers to media of incidence with $n_i > n_t$.

$$\frac{d\varphi}{dx}$$

is the local phase gradient imposed by the nano-structure layer. The critical angle can be shown by Equation 2.

$$\theta_c = \sin^{-1}\left(\frac{n_t}{n_i} - \frac{\lambda_0}{2\pi n_i}\frac{d\varphi}{dx}\right) \qquad \text{(Equation 2)}$$

Equation 2 can be applied such that the critical angle of TIR can be modified using the local gradient of phase (i.e., of a nano-structure layer as disclosed herein) imposed by the nanostructure. For example, for an operating wavelength of 450 nm and $n_i=1.78$ of $n_t=1.41$ and no phase gradient $$\frac{d\varphi}{dx} = 0,$$

the equation reduces to traditional Snell's law predicting a critical angle $\theta_c=52.4$ degrees.

However, at the same wavelength of 450 nm, if $$-\frac{\lambda_0}{2\pi n_i}\frac{d\varphi}{dx} = 0.2$$

then θc=~83 degrees. This yields a phase change of $$\frac{d\varphi}{dx} = 0.005 \text{ rad/nm}$$

which can be achieved by use of resonant or non-resonant nano-structure layers, as disclosed herein. The nano-structure layer is arranged such that it has a local phase gradient with a slope sufficient to increase the TIR critical angle. The example critical angle $\theta_c=\sim83$ degrees is equivalent to having an effective refractive index of 1.765. As applied within an adhesive layer, as disclosed herein, a nanostructure layer provides a modified effective RI of 1.765 for the adhesive layer by modifying the critical angle to be $\theta_c$=~83 degrees. This change in critical angle allows emission of light through the adhesive layer with a nano-structure layer as if the RI of the adhesive layer is an effective higher RI which more closely matches the RI of the substrate and/or wavelength converting layer and, thus results in decreased reflection.

A nano-structure layer may include meta-surfaces, plasmonic nanostructures, meta-molecules, photonic crystals, and/or other applicable nano-structures. As used herein, photonic crystals and meta-surfaces may be periodic arrangements of meta-atoms and/or nano-antennae. A meta-atom nano-structure layer may include an array of meta-atoms. A nano-antenna nano-structure layer may include one or more nano-antennae. Nano-structured layers, as disclosed herein, may incorporate the design of LED devices with nano scale optical antennas placed on an LED surface (e.g., a sapphire substrate) and/or within an adhesive layer.

The nano-structured layers disclosed herein may include nano-antennae placed in a pre-determined arrangement with an optimized local phase gradient within an adhesive layer. A nano-structured layer may include photonic materials incorporated into photonic crystals and/or meta-surfaces which may include meta-atoms and/or nano-antennae such that the largest dimension for a meta-atom or nano-antenna is less than 1000 nm. The nano-antennae can be implemented as an array of nanoparticles located in the nano-structure layer, as further disclosed herein. The nano-antennas may be arranged in either periodic or a-periodic patterns. In an analogy with chemical molecules composed of atoms, a meta-surface is composed of meta-atoms with the meta-atoms combined together and interacting to give the meta-surface unique optical properties. The size of individual meta-surfaces may be sub-wavelength or may be formed at the same order of wavelength of use.

A nano-structured layer can include nano-antennae that are distributed throughout a host dielectric medium. The sizes of the nano-antennae may be a sub-wavelength of order of wavelength.

A nano-structured layer may be designed with a configuration so that its optical properties have a resonance or controllable properties at one or more wavelengths such that the configuration causes the TIR critical angle of incident based on the configuration of the nano-structure layer 110. This may be achieved by tuning the structure and chemical composition of the nano-structure layer so as to simultaneously excite electric and magnetic dipoles, quadrupoles and higher order multipoles within the nano-structure layer. The simultaneous excitation of the dipoles and higher order multipoles may provide the local phase gradient at the nano-structure layer to increase the TIR critical angle of the adhesive layer.

Figure 1D:
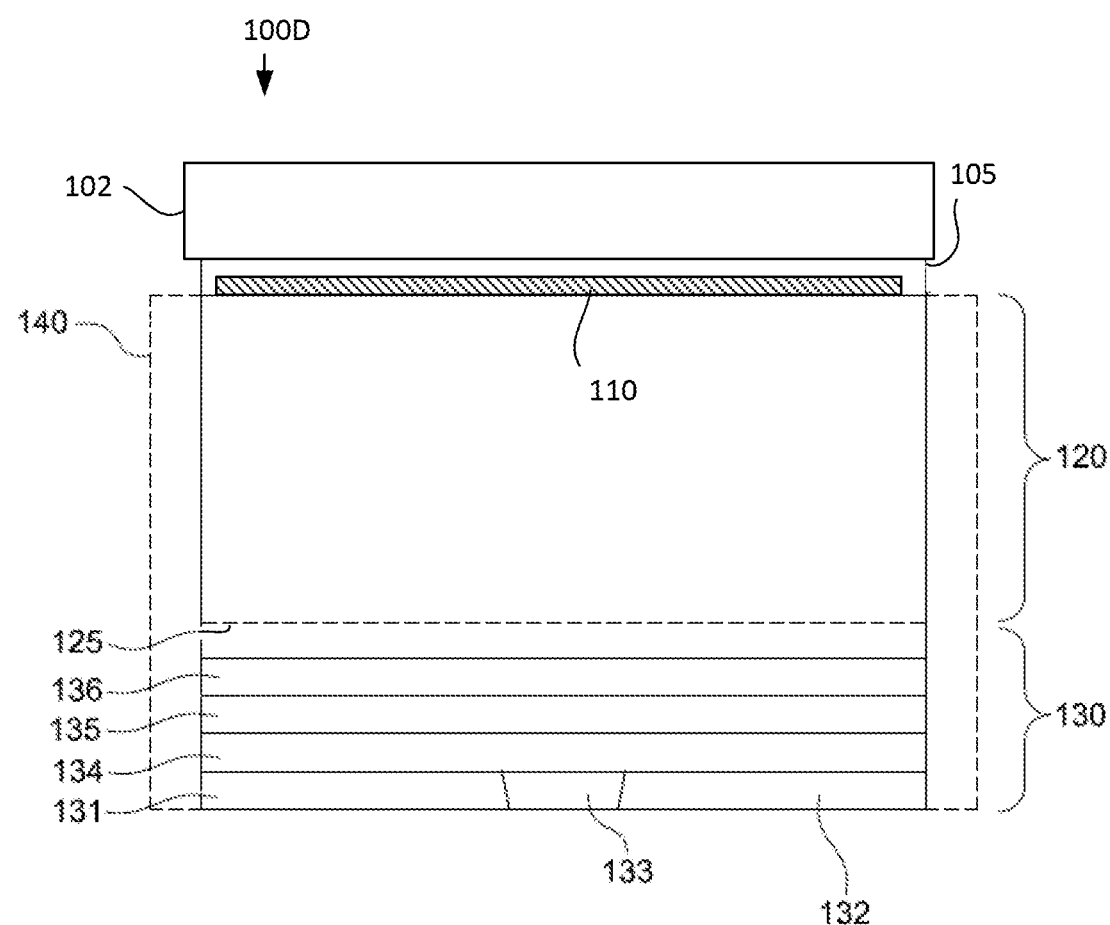
FIG. 1D is a diagram showing light beam emission.

FIG. 1D shows a LED device 100D which may be a high brightness emitter or a medium power emitter such as a chip scale package (CSP) die with a sapphire substrate. LED device 100D may be similar to LED device 100B of FIG. 1C. As shown in FIG. 1D, adhesive layer 105 with a nano-structure layer 110 may be located between substrate 120 and wavelength converting layer 102. The substrate 120 may include a smooth LES that enables deposition of the adhesive layer 105 with a nano-structure layer 110. The substrate 120 may comprise sapphire which is an aluminum oxide Al2O3)(also known as corundum and can exhibit properties including being very hard, strong, easy to machine flat, a good electrical insulator, and an excellent thermal conductor. Sapphire is generally transparent when produced synthetically with the blue color in naturally occurring sapphires (and the red in rubies, which are another form of corundum) comes from impurities in the crystal lattice. In other LEDs, the sapphire may be replaced with gallium nitride (GaN). The semiconductor layers 130 may be in the region where light is emitted as electroluminescence occurs.

As shown in FIG. 1D, the sidewalls of the substrate 120 may be covered by sidewall material 140. The sidewall material 140 may also cover one or more layers of the semiconductor layers 130 such that either the same sidewall material 140 covers the substrate 120 and the semiconductor layers 130 or a different material may cover the sidewalls of the substrate 120 than the semiconductor layers 130. The sidewall material 140 may be any applicable reflecting or scattering material. According to an embodiment, the sidewall material 140 may be a distributed Bragg reflector (DBR).

By way of example and in order to provide concrete description, a flip chip of chip scale package (CSP) LED with a sapphire substrate is described, although the principles and teaching herein may be applied to any applicable LED design. A sapphire based CSP emitter with a smooth light escape surface (LES) may allow deposition of adhesive layer 105 with a nano-structure layer 110 such that light emitted from the active layer 135 is incident upon the adhesive layer 105 with a nano-structure layer 110 via the sapphire substrate. It will be understood that the LED device 100D includes components and/or layers that are the same as LED device 100B, as indicated by the same reference numbers.

Figure 1E:
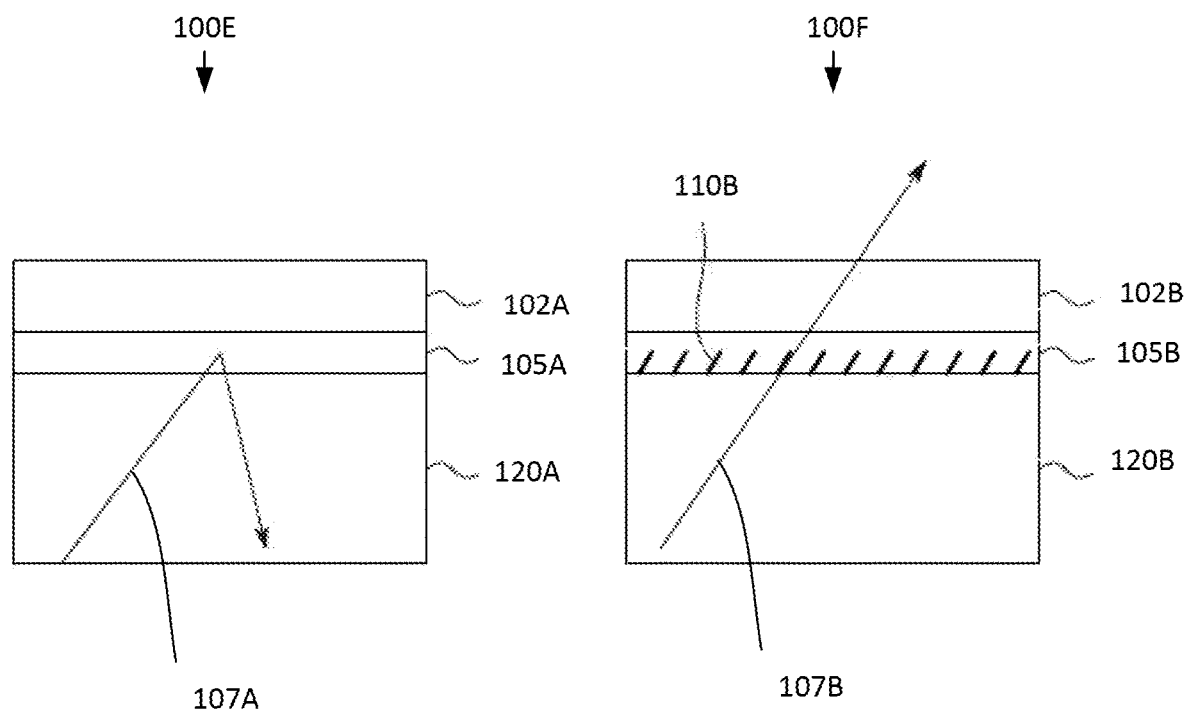
FIG. 1E is a multi nano-photonic structure array.

FIG. 1E shows an LED device 100E with a substrate 120A, adhesive layer 105A, and wavelength converting layer 102A. The RI of the substrate 120A and wavelength converting layer 102A may be higher than the RI of the adhesive layer 105A such that the TIR critical angle $\theta c$=52.4. The light beam 107A may traverse the substrate 120A and may be incident upon the adhesive layer 105A at an angle greater than the TIR critical angle $\theta c$=52.4, such as at 60 degrees. Accordingly, the light beam 107A may be reflected, as shown. FIG. 1E also shows an LED device 100F with a substrate 120B, adhesive layer 105B, and wavelength converting layer 102B. The adhesive layer 105B includes a nano-structure layer 110B configured with an optimized local phase gradient of the adhesive layer 105B. The RI of the substrate 120B and wavelength converting layer 102B may be higher than the RI of the adhesive layer 105B material without the nano-structure layer 110B. However, based on the local phase gradient of the nano-structure layer 110B, the TIR critical angle through the adhesive layer 105B may be greater than $\theta c$=52.4 and may be, for example, $\theta c$=~83 degrees. A light beam 107B may traverse the substrate 120A and may be incident upon the adhesive layer 105B at the same angle as light beam 107A was incident upon the adhesive layer 105A of LED device 100E (i.e., 60 degrees according to this example). Based on the increased critical angle of $\theta c$=~83 degrees provided by the nano-structure layer 110B, the light beam 107B may be passed through the adhesive layer 105B without being reflected and may be incident upon the wavelength converting layer 102B.

Photonic crystals and/or meta-surfaces in a nano-structure layer may be configured with a spatial gradient of phase. The nano-antenna may be formed from nano-cylinders, nano-cones, or nano-cones with vertical or coaxial dimmers, arranged in either a hexagonal or rectangular lattice. The lattice period may be sub-wavelength or larger than wavelength. The nano-antennae may be Huygen's meta-atoms or support waveguide modes. A Huygen's nano-structure layer with spatial variation of radius can also be used to achieve the desired narrowing of the beam. Each photonic crystal or meta-surface may present a certain amount of beam bending properties such that incident beams can be shaped to the required angular distribution. In the cases of the nano-cylinder vertical dimer coaxial dimer in nano-cone, interfering modes within the meta-atom or nano-antenna provide additional control of the light emitted through the nano-structure layer, using structural parameters.

Figure 1F:
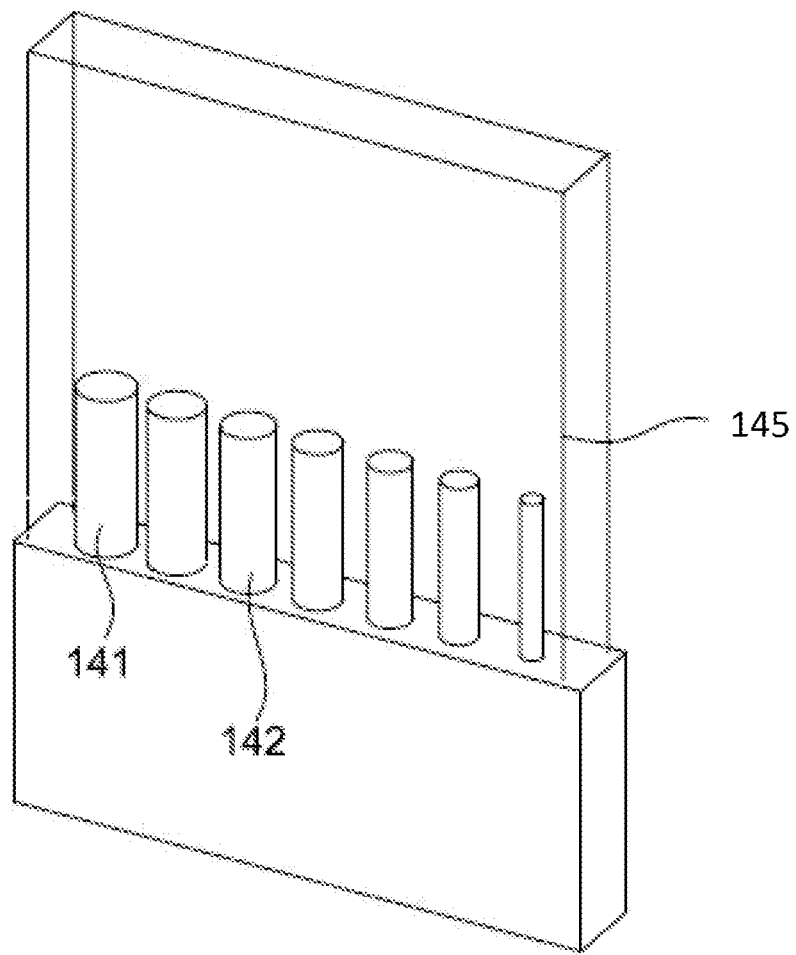
FIG. 1F is another multi nano-photonic structure array.

Nano-antennae may be formed or arrayed as single nano-photonic structures such that the same nano-antenna is repeated numerous times to form a nano-structured layer. Alternatively or in addition, nano-antennae may be formed or arrayed as multi nano-photonic structures such that an array of nano-antennae is repeated numerous times to form a nano-structured layer. FIG. 1F illustrates an example multi nano-photonic structure 145. As shown, the multi nano-photonic structure 145 includes nano-cylinders 141 and 142 such that the different nano-cylinders 141 and 142 have one or more different properties when compared to each other. As a visual example, as shown in FIG. 1F, nano-cylinder 142 is smaller in volume than the nano-cylinder 141. This multi nano-photonic structure may be arrayed such that nano-structure layer 110 of FIG. 1D includes multiple iterations of multi nano-photonic structure 145 (in one, two, or three dimensions). Each small multi nano-photonic structure 145 of a nano-structure layer 110 may contribute to the optimized local phase gradient at the location where a light beam strikes the nano-structure layer 110. The design and placement of nano-structure layer 110 may selected by an optimizer.

As an example of the configuration shown in FIG. 1F, the nano-structure layer may include nano-cylinders or nano-cones of titanium dioxide with heights of 150 nm, 250 nm or 600 nm. The radii of the cylinders may be varied in the lateral axes and can be in the range from 50 nm to 120 nm with periodicities ranging from 250 nm to 300 nm. As shown in FIG. 1F, different unit cells with different periods and radii distributions can be arranged on a substrate surface. The position of such spheres can be optimized using conventional optimization software to improve the overall flux emitted by an LED. According to an embodiment, nano-structures may only be optimized to work within a desired wavelength such as, for example, a blue LED emission spectral region (center wavelengths varying from 440-450 nm with bandwidths of 30-50 nm).

Figure 2A:
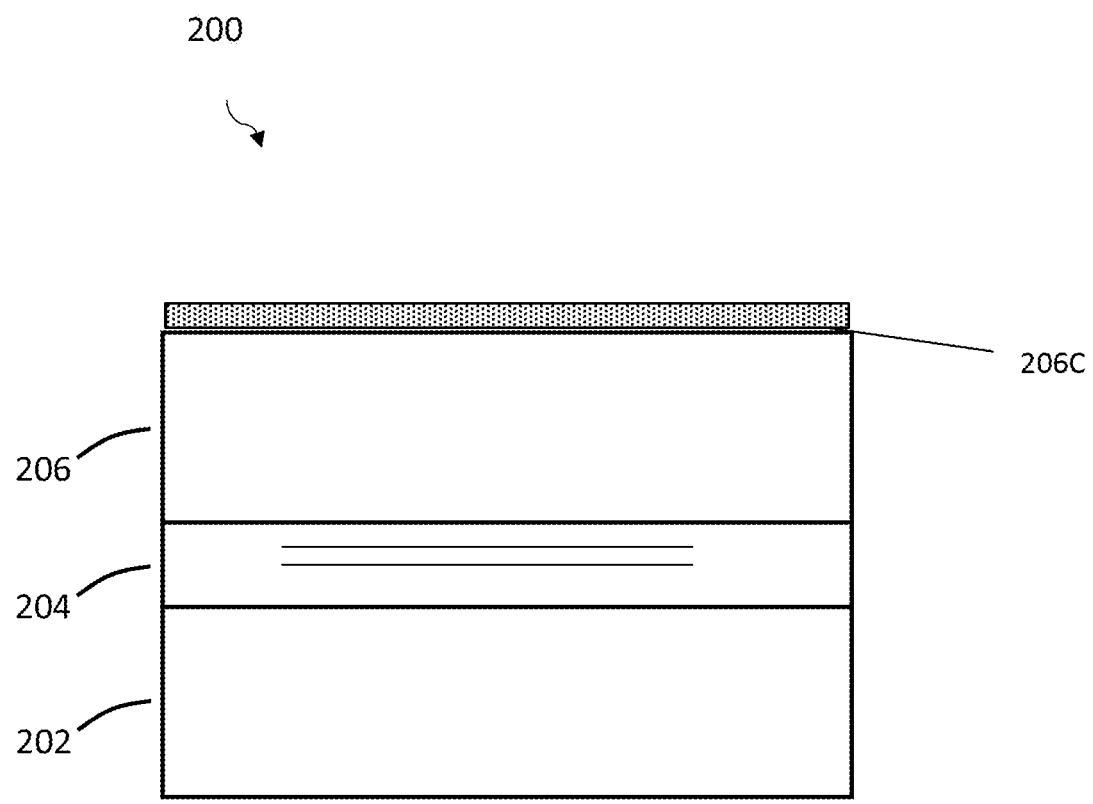
FIG. 2A is a diagram showing an Light Emitting Diode (LED) device.

FIG. 2A is a diagram of an LED device 200 in an example embodiment. The LED device 200 may include one or more epitaxial layers 202, an active layer 204, and a substrate 206. In other embodiments, an LED device may include a wavelength converter layer and/or primary optics. As shown in FIG. 2A, the active layer 204 may be adjacent to the substrate 206 and emit light when excited. The epitaxial layers 202 may be proximal to the active layer 204 and/or one or more intermediate layers may be between the active layer 204 and epitaxial layers 202. The substrate 206 may be proximal to the active layer 204 and/or one or more intermediate layers may be between the active layer 204 and substrate 206. The active layer 204 emits light into the substrate 206. The adhesive layer 105 of FIG. 1D or the nano-structure layer 110 may be placed between substrate 206 and wavelength converting layer 206C, to implement techniques disclosed herein.

Figure 2B:
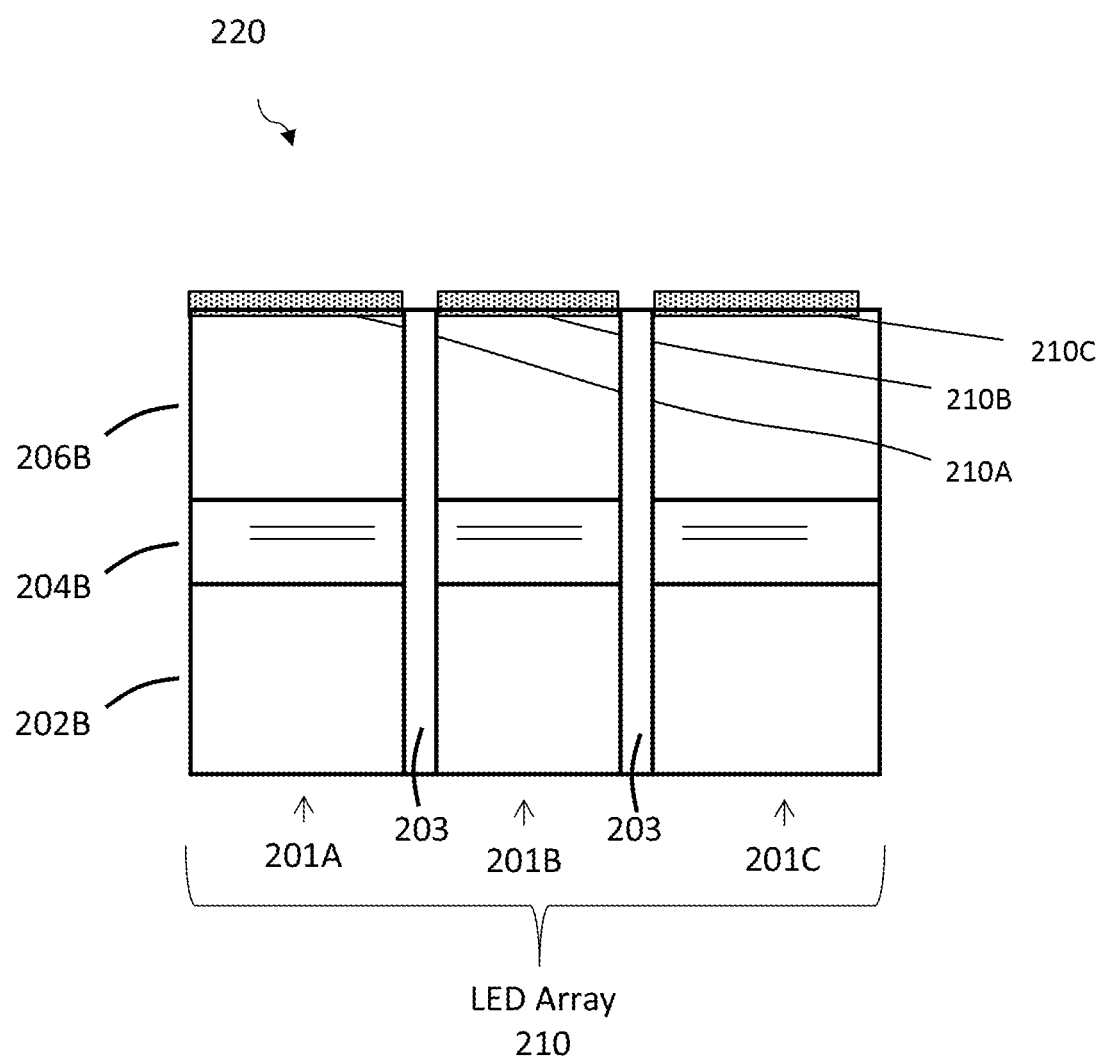
FIG. 2B is a diagram showing multiple LED devices.

FIG. 2B shows a cross-sectional view of a lighting system 220 including an LED array 210 with pixels 201A, 201B, and 201C. The LED array 210 includes pixels 201A, 201B, and 201C each including a respective substrate 206B active layer 204B and an epitaxial layer 202B. Pixels 201A, 201B, and 201C, in the LED array 210 may be formed using array segmentation, or alternatively using pick and place techniques and may, for example, emit light at different peak wavelengths such as red, green, and blue. The spaces 203 shown between one or more pixels 201A, 201B, and 201C may include an air gap or may be filled by a material such as a metal material which may be a contact (e.g., n-contact). According to some embodiments, secondary optics such as one or more lenses and/or one or more waveguides may be provided. As shown, wavelength converting layers 210A, 210B, and 210C may be placed above respective pixels 201A, 201B, and 201B and may be attached by respective adhesive layers and/or nano-structure layers. The respective adhesive layers may include chain link molecules and/or nano-structure layers, as disclosed herein. The pixels 201A, 201B, and 201C may each correspond to a different color output (e.g., red, green, blue).

The LED device 200 or pixels 201A, 201B, and 201C may be single wavelength emitters and may be powered individually or via as an array. The LED device 200 or pixels 201A, 201B, and 201C may be part of an illumination system that includes one or more electronics boards, power modules, sensors, connectivity and control modules, LED attach regions, or the like. Pixels in an array may be powered based on different channel signals and their operation may be determined by a microcontroller.

Figure 3:
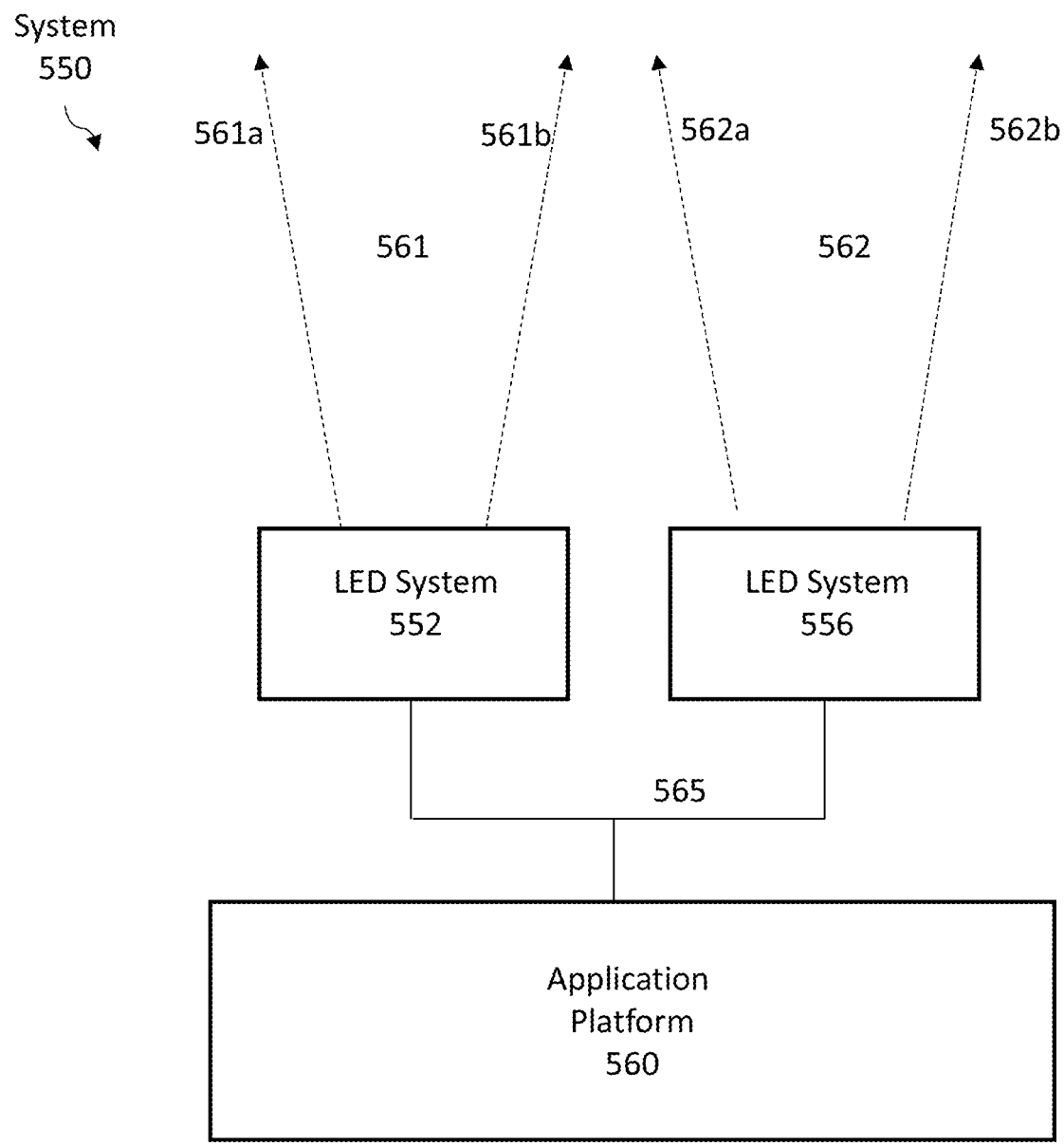
FIG. 3 is a diagram of an example application system.

FIG. 3 shows an example system 550 which includes an application platform 560 and LED systems 552 and 556. The LED system 552 produces light beams 561 shown between arrows 561a and 561b. The LED system 556 may produce light beams 562 between arrows 562a and 562b. As an example embodiment, the LED system 552 and 556 may be part of an automobile and may emit infrared (IR) light communication beams such that an oncoming vehicle in the path of the light beams 561 and/or 562 is able to receive communication from the automobile. In example embodiments, the system 550 may be a mobile phone of a camera flash system, indoor residential or commercial lighting, outdoor light such as street lighting, an automobile, a medical device, AR/VR devices, and robotic devices.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560.

In various embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VC- SEL). The one or more sensors may sense a response to the emitted beam or any other applicable input.

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

Although features and elements are described above in particular combinations, one of ordinary skill in the art will appreciate that each feature or element can be used alone or in any combination with or without the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

What is claimed is:

1. A light emitting device comprising:
    a semiconductor light emitting diode structure;
    a substrate transparent to light emitted by the semiconductor light emitting diode structure and comprising a flat top surface, an oppositely positioned bottom surface, and side surfaces connecting the top and bottom surfaces, the bottom surface disposed on or adjacent the semiconductor light emitting diode structure;
    a ceramic phosphor wavelength converting structure comprising a flat surface disposed adjacent the flat top surface of the substrate; and
    an adhesive layer disposed between and bonding the substrate and the ceramic phosphor wavelength converting structure to each other, the adhesive layer comprising:
        a plurality of short chain molecules each having a chain length of less than or equal to 100 nanometers, a first end attached to the flat surface of the ceramic phosphor wavelength converting structure, and a second end attached to the top flat surface of substrate; or
        a nanostructured layer imposing a local phase gradient that increases a critical angle for total internal reflection for light emitted into the substrate from the semiconductor light emitting diode structure and incident on the adhesive layer from the substrate; or
        a plurality of short chain molecules each having a chain length of less than or equal to 100 nanometers, a first end attached to the flat surface of the ceramic phosphor wavelength converting structure, and a second end attached to the top flat surface of substrate, and
        a nanostructured layer imposing a local phase gradient that increases a critical angle for total internal reflection for light emitted into the substrate from the semiconductor light emitting diode structure and incident on the adhesive layer.

2. The light emitting device of claim 1, wherein the adhesive layer comprises a plurality of short chain molecules each having a chain length of less than or equal to 100 nanometers, a first end attached to the flat surface of the ceramic phosphor wavelength converting structure, and a second end attached to the top flat surface of substrate.

3. The light emitting device of claim 2, wherein the short chain molecules each have a chain length of less than or equal to 10 nanometers.

4. The light emitting device of claim 2, comprising an organosilane self-assembled monolayer coating the top surface of the substrate or the flat surface of the ceramic phosphor wavelength converting structure and facilitating attachment of the short chain molecules to the coated surface.

5. The light emitting device of claim 1, wherein the adhesive layer comprises a nanostructured layer imposing a local phase gradient that increases the critical angle for total internal reflection for light emitted into the substrate from the semiconductor light emitting diode structure and incident on the adhesive layer from the substrate.

6. The light emitting device of claim 5, wherein the nanostructured layer imposes a local phase gradient that increases to at least 60 degrees the critical angle for total internal reflection for light emitted into the substrate from the semiconductor light emitting diode structure and incident on the adhesive layer from the substrate.

7. The light emitting device of claim 6, wherein the nanostructured layer imposes a local phase gradient that increases to at least 80 degrees the critical angle for total internal reflection for light emitted into the substrate from the semiconductor light emitting diode structure and incident on the adhesive layer from the substrate.

8. The light emitting device of claim 5, wherein the nanostructured layer is or comprises a metasurface or a metamaterial.

9. The light emitting device of claim 8, wherein the metasurface or metamaterial comprises a plurality of nanoantennas.

10. The light emitting device of claim 9, wherein the plurality of nanoantennas are arranged in a lattice.

11. The light emitting device of claim 9, wherein each nanoantenna has a largest dimension less than or equal to a wavelength of light emitted by the semiconductor light emitting diode structure.

12. The light emitting device of claim 1, wherein the adhesive layer comprises a plurality of short chain molecules each having a chain length of less than or equal to 100 nanometers, a first end attached to the flat surface of the ceramic phosphor wavelength converting structure, and a second end attached to the top flat surface of substrate, and a nanostructured layer imposing a local phase gradient that increases the critical angle for total internal reflection for light emitted into the substrate from the semiconductor light emitting diode structure and incident on the adhesive layer.

13. The light emitting device of claim 12, comprising an organosilane self-assembled monolayer coating the top surface of the substrate or the flat surface of the ceramic phosphor wavelength converting structure and facilitating attachment of the short chain molecules to the coated surface.

14. The light emitting device of claim 12, wherein the nanostructured layer imposes a local phase gradient that increases to at least 60 degrees the critical angle for total internal reflection for light emitted into the substrate from the semiconductor light emitting diode structure and incident on the adhesive layer from the substrate.

15. The light emitting device of claim 14, wherein the nanostructured layer imposes a local phase gradient that increases to at least 80 degrees the critical angle for total internal reflection for light emitted into the substrate from the semiconductor light emitting diode structure and incident on the adhesive layer from the substrate.

16. The light emitting device of claim 12, wherein the nanostructured layer is or comprises a metasurface or a metamaterial.

17. The light emitting device of claim 16, wherein the metasurface or metamaterial comprises a plurality of nanoantennas.

18. The light emitting device of claim 17, wherein the plurality of nanoantennas are arranged in a lattice.

19. The light emitting device of claim 18, wherein each nanoantenna has a largest dimension less than or equal to a wavelength of light emitted by the semiconductor light emitting diode structure.

* * * * *